United States Patent
Lee et al.

(10) Patent No.: US 9,312,247 B2
(45) Date of Patent: Apr. 12, 2016

(54) ILLUMINATING DEVICE AND LIGHT MODULE THEREOF

(71) Applicant: INDUSTRIAL TECHNOLOGY RESEARCH INSTITUTE, Hsinchu (TW)

(72) Inventors: Chun-Hsing Lee, Hsinchu (TW);
Ya-Hui Chiang, Taoyuan County (TW);
Ling-Yu Tsai, Taichung (TW);
Cheng-Da Shaw, Taipei (TW);
Chien-Chun Lu, New Taipei (TW);
Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 347 days.

(21) Appl. No.: 13/975,303

(22) Filed: Aug. 24, 2013

(65) Prior Publication Data

US 2014/0185281 A1  Jul. 3, 2014

(30) Foreign Application Priority Data

Dec. 27, 2012  (TW) .............................. 101150408 A

(51) Int. Cl.
| | |
|---|---|
| H01L 25/075 | (2006.01) |
| F21K 99/00 | (2010.01) |
| F21S 8/06 | (2006.01) |
| F21V 7/00 | (2006.01) |
| H01L 33/50 | (2010.01) |
| F21Y 101/02 | (2006.01) |
| F21Y 111/00 | (2006.01) |
| F21Y 113/00 | (2006.01) |

(52) U.S. Cl.
CPC ............ *H01L 25/0753* (2013.01); *F21K 9/135* (2013.01); *F21S 8/06* (2013.01); *F21V 7/0016* (2013.01); *F21Y 2101/02* (2013.01); *F21Y 2111/001* (2013.01); *F21Y 2113/005* (2013.01); *H01L 33/504* (2013.01); *H01L 2924/0002* (2013.01)

(58) Field of Classification Search
USPC .................................................. 362/230, 231
See application file for complete search history.

(56) References Cited

U.S. PATENT DOCUMENTS

| | | | |
|---|---|---|---|
| 7,264,367 B2* | 9/2007 | Hulse ........................ | F21K 9/00 362/231 |
| 2004/0093045 A1 | 5/2004 | Bolta | |
| 2009/0281604 A1 | 11/2009 | De Boer et al. | |
| 2010/0157573 A1* | 6/2010 | Toda ........................ | F21K 9/00 362/84 |

(Continued)

FOREIGN PATENT DOCUMENTS

| | | |
|---|---|---|
| JP | 2011-165577 | 8/2011 |
| TW | 200940868 | 10/2009 |

(Continued)

OTHER PUBLICATIONS

Taiwan Patent Office, Office Action, Patent Application Serial No. 101150408, Nov. 21, 2014, Taiwan.

(Continued)

*Primary Examiner* — Laura Tso

(57) ABSTRACT

An illuminating device includes a first light module and a second light module. The first light module emits a first light beam to a first illuminating area, and the second light module emits a second light beam to a second illuminating area. The first light module includes a first blue chip emitting a blue light with a main wave peak from 461 nm to 480 nm.

49 Claims, 5 Drawing Sheets

(56) References Cited

U.S. PATENT DOCUMENTS

| | | | |
|---|---|---|---|
| 2011/0075105 A1 | 3/2011 | Ouyang et al. | |
| 2011/0221330 A1* | 9/2011 | Negley | H01L 33/504 313/501 |
| 2012/0020071 A1* | 1/2012 | McKenzie | A01G 7/045 362/231 |
| 2013/0077299 A1* | 3/2013 | Hussell | F21K 9/50 362/231 |

FOREIGN PATENT DOCUMENTS

| | | |
|---|---|---|
| TW | 201015025 A1 | 4/2010 |
| TW | 201210819 | 3/2012 |

OTHER PUBLICATIONS

Cai Zhe et al., "Interpretation of Guidance on Manufacturing Requirements Relating to Non-Laser Optical Radiation Safety," Zhaoming Gongcheng Xuebao, Oct. 2011, pp. 47-50, vol. 22, Wanfang Data, China.

"Optical Safety of LED Lighting," European Lamp Companies Federation, Jul. 2011, pp. 1-18, CELMA, US.

F. Behar-Cohen et al., "Light-Emitting Diodes (LED) for Domestic Lighting: Any Risks for the Eye?," Progress in Retinal and Eye Research, May 2011, pp. 239-257, vol. 30, Elsevier, US.

Wu Xiaochen et al., "Standards About Optical Radiation Safety of LED Luminaires," China Light & Lighting, Aug. 2011, pp. 32-35, China.

"Photobiological Safety of Lamps and Lamp Systems," Jul. 2006, 89 pages, Comission Internationales de L'Eclairage, Switzerland.

Haiyan Ou et al, "Spectral Design Flexibility of LED Brings Better Life," Light-Emitting Diodes: Materials, Devices, and Applications for Solid State Lighting XVI, Jan. 2012, 7 pages, vol. 8278, SPIE, US.

* cited by examiner

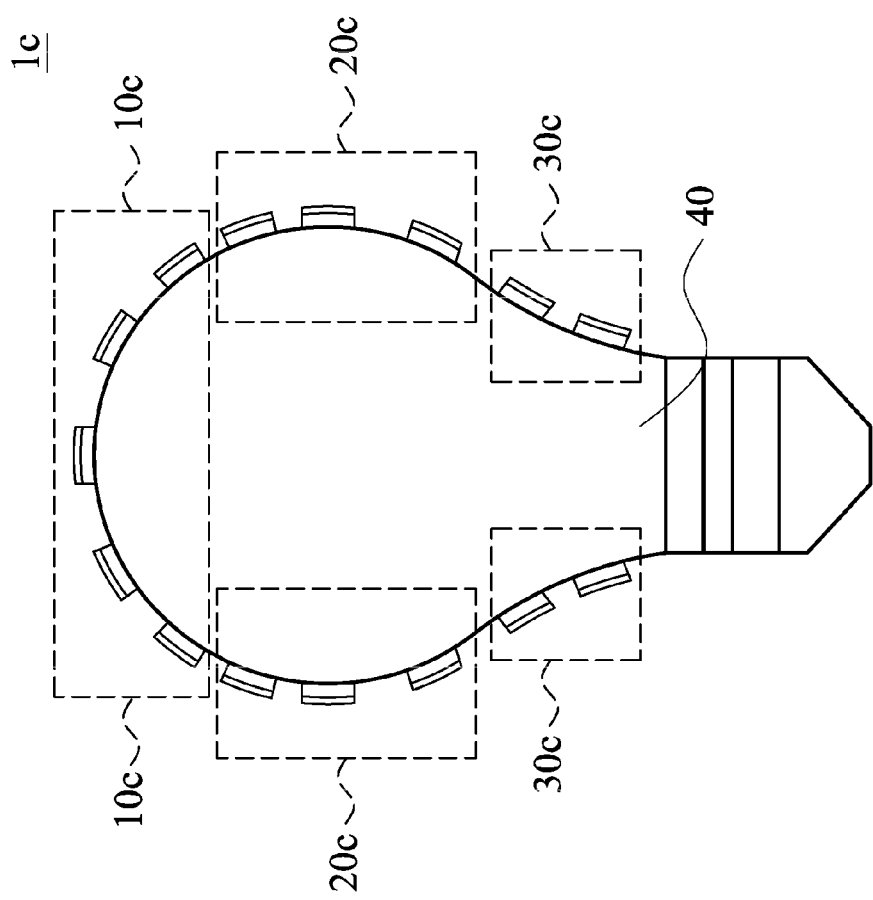

ILLUMINATING DEVICE AND LIGHT MODULE THEREOF

CROSS-REFERENCE TO RELATED APPLICATIONS

The present application is based on, and claims priority from, Taiwan Application Serial Number 101150408, filed on Dec. 27, 2012, the disclosure of which is hereby incorporated by reference herein in its entirety.

TECHNICAL FIELD

The technical field relates to an illuminating device and a light module thereof, and in particular, to an illuminating device and a light module thereof having blue chips.

BACKGROUND

For the purpose of saving power, illuminating devices usually utilize LEDs (light-emitting diodes) as a light module. However, for emitting white light from the light module, a fluorescent layer is coated on a blue LED to transform a part of blue light to yellow light, and then the blue light and the yellow light are mixed to form white light. After the blue light, which has a higher circadian stimulus, is emitted to the retinas of users, melatonin may be inhibited by the biological clock system, and work efficiency may be increased. However, the blue light emitted by a conventional blue LED has a wave peak in a range from 445 nm to 460 nm. According the luminous radiance biological safety standards, IEC 62471, the blue light having the wave peak has the most hazardous to the retinas of people's eyes.

SUMMARY

The present disclosure provides an illuminating device including a first light module and a second light module. The first light module emits a first light beam to a first illuminating area. The first light module includes a first blue chip to emit a blue light. The second light module emits a second light beam to a second illuminating area. The blue light has a main wave peak in a range from 461 nm to 480 nm.

The present disclosure provides an illuminating device including a light module emitting a light beam. The light module includes a blue chip to emit a blue light, and the blue light has a main wave peak in a range from 461 nm to 480 nm.

The present disclosure provides a light module to emit a light beam. The light module includes a blue chip. The blue chip emits a blue light, and the blue light has a main wave peak in a range from 461 nm to 480 nm.

BRIEF DESCRIPTION OF THE DRAWINGS

The present disclosure can be more fully understood by reading the subsequent detailed description and examples with references made to the accompanying drawings, wherein:

FIG. 6 is a schematic view of an illuminating device according to a fourth embodiment of the present disclosure.

DETAILED DESCRIPTION

The light module and the illuminating device of the present disclosure utilize blue chips having main wave peaks in a range from 461 nm to 480 nm. Thus, a light having wavelength in a range of from 445 nm to 460 nm, which can damage the retinas of users, is not sufficient protection for the eyes of users. Moreover, a second light module may be utilized to increase the luminance of the environment and the circadian stimulus factor, and thus increase the working efficiency of users.

Figure 1:
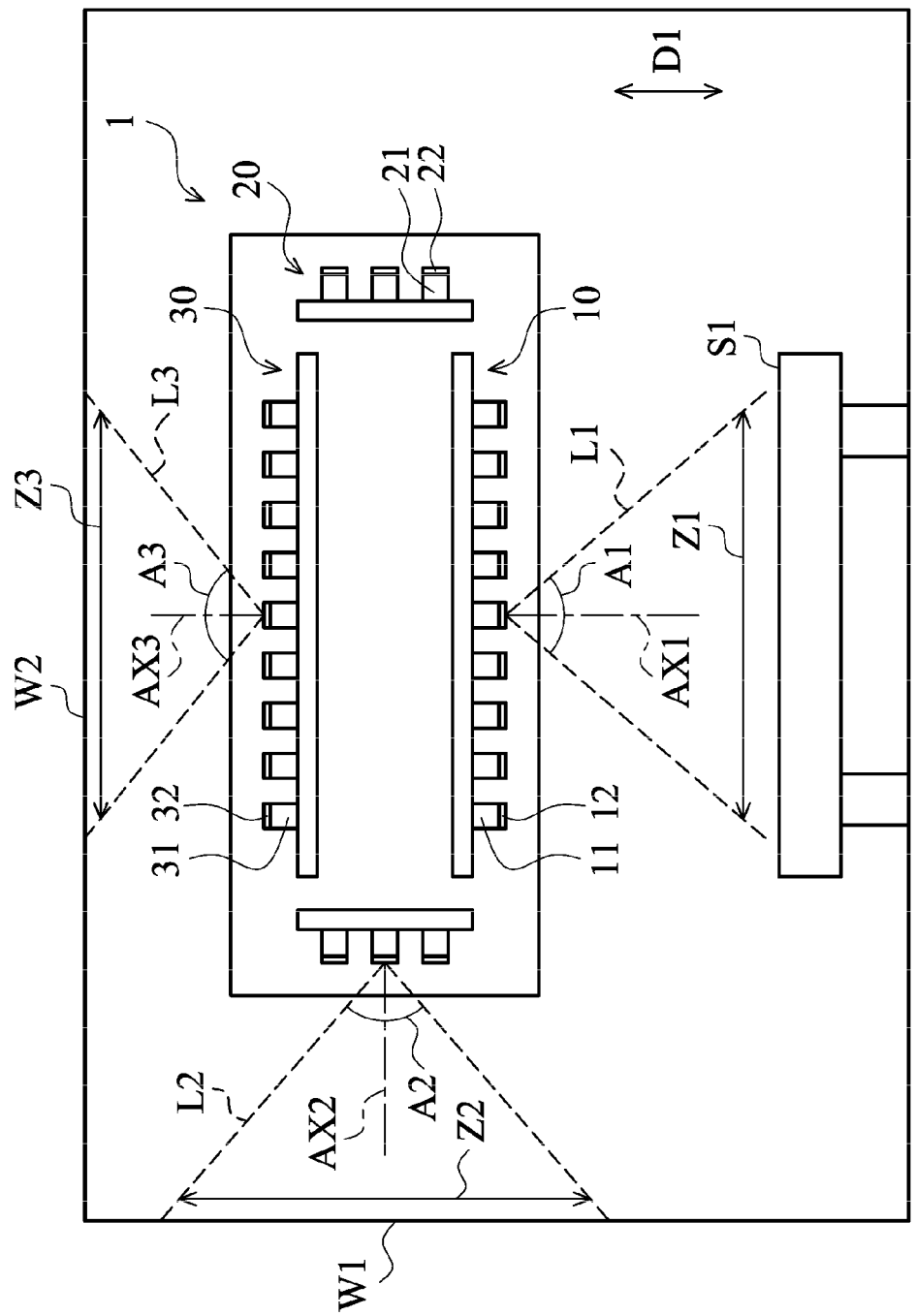
FIG. 1 is a schematic view of an illuminating device according to a first embodiment of the present disclosure.

FIG. 1 is a schematic view of an illuminating device 1 according to a first embodiment of the present disclosure. The illuminating device 1 includes a first light module 10, a second light module 20, and a third light module 30. The first light module 10 emits a first light beam L1 to a first illuminating area Z1, the second light module 20 emits a second light beam L2 to a second illuminating area Z2, and the third light module 30 emits a third light beam L3 to a third illuminating area Z3.

The first illuminating area Z1 is defined as an active area for users, and the second illuminating area Z2 and the third illuminating area Z3 are located on a wall W1 and/or ceiling W2. In the embodiment, the first illuminating area Z1 is located on a table surface S1, the second illuminating area Z2 is located on a wall W1, and the third illuminating area Z3 is located on a ceiling W2.

The first light beam L1 has a first optical axis AX1 and a first light beam fan angle A1, and the first light beam L1 is transmitted along the first optical axis AX1. A first angle between the first optical axis AX1 and a vertical direction D1 is from 0 degrees to 45 degrees. The first light beam fan angle A1 is from 30 degrees to 80 degrees, or less than 45 degrees. In the embodiment, the first angle between the first optical axis AX1 and the vertical direction D1 is about 0 degrees, and the first light beam fan angle A1 is about 45 degrees.

The second light beam L2 has a second optical axis AX2 and a second light beam fan angle A2. The second light beam L2 is transmitted along the second optical axis AX2. A second angle between the second optical axis AX2 and the vertical direction D1 is from 45 degrees to 90 degrees, and the second light beam fan angle A2 is from 60 degrees to 130 degrees. In the embodiment, the second angle between the second optical axis AX2 and the vertical direction D1 is about 90 degrees, and the second light beam fan angle A2 is about 80 degrees.

The third light beam L3 has a third optical axis AX3 and a third light beam fan angle A3, and the third light beam L3 is transmitted along the third optical axis AX3. A third angle between the third optical axis AX3 and the vertical direction D1 is from 0 degrees to 60 degrees, and the third light beam fan angle A3 is from 70 degrees to 170 degrees. In the embodiment, the third angle between the third optical axis AX3 and the vertical direction D1 is about 0 degrees, and the third light beam fan angle A3 is about 100 degrees.

The first light beam L1, the second light beam L2, and the third light beam L3 may be white light, and the color temperatures (CCT) thereof is respective from 2500K to 3500K, from 4000K to 5000K, or from 6000K to 7000K.

The first light module 10 includes a plurality of blue chips 11. In the present disclosure, the chip may be a LED (light emitting diode). The blue chip 11 may be a GaN blue LED.

Since the substrate used in the epitaxial process for the blue chip 11 may includes Sapphire, SiC, or Si, the blue chip 11 is able to emit a blue light having a main wave peak in a range from 461 nm to 480 nm. In the embodiment, the main wave peak wavelength is about 463 nm.

The light module of the present disclosure may be assembled by the blue chip 11 having a main wave peak in a range from 461 nm to 480 nm with other color chips or other phosphors with a wavelength converter function. For example, the blue chip may be assembled with a yellow chip, with a green chip and a red light chip, or with a green chip, a cyan chip and a red light chip. In other cases, a blue chip may be assembled with a yellow phosphor, with a yellow phosphor and a red phosphor, with a green chip and a red phosphor, with a green phosphor and a red chip, or with a green chip, a yellow phosphor and a red phosphor. The assemblies of the light module are not limited. There are some cases described as follows.

Figure 2:
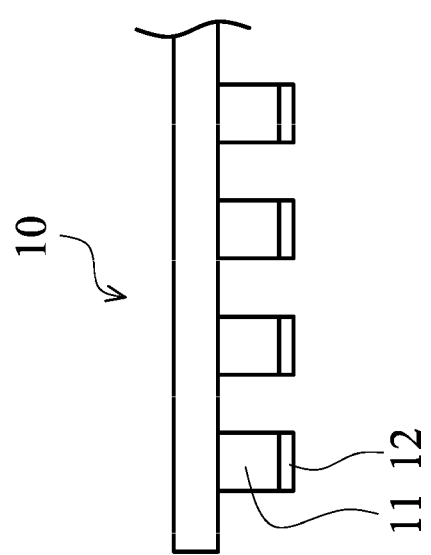
FIG. 2 is a schematic view of the first light module according to the first embodiment of the present disclosure.

FIG. 2 is a schematic view of the first light module 10 according to the first embodiment of the present disclosure. In the embodiment, a fluorescent layer 12 is disposed on a light emitting surface of each of the blue chips 11. The fluorescent layer 12 includes from 1 wt % to 20 wt % of green phosphor and from 1 wt % to 20 wt % of red phosphor. The green phosphor may be a silicate phosphor or an aluminum phosphor. The red phosphor may be a nitride phosphor or a sulfide phosphor. When the blue light passes through the fluorescent layer 12, the fluorescent layer 12 transforms a part of the blue light to a green light and a red light. Then, the blue light, the green light, and the red light are mixed to form a white light, the first light beam L1.

By the blue chip 11 having a main wave peak in a range from 461 nm to 480 nm and the fluorescent layer 12, the blue light hazard action factor the first light beam L1 is about 0.133 W/W accommodating safety standards for blue light. A lower blue light hazard action factor means that the retina damaged by the blue light is lesser. Since the blue chip 11 having the main wave peak in a range from 461 nm to 480 nm of the embodiment, a blue light having a main wave peak in a range from 445 nm to 460 nm, which greatly damages the retina, is decreased, and thus the eyes of users are more safer.

The blue light hazard action factor (BLH/W) is defined as effective blue light hazard radiance quantities (BLH) per watt. The formula of the effective blue light hazard radiance quantities is described as follows.

$$BLH = \int X_{e\lambda} \cdot B(\lambda) d\lambda$$

In the formula, the $X_{e\lambda}$ is a spectral power distribution, $B(\lambda)$ is a blue light hazard weighting function, and $\lambda$ is a wavelength.

In another case, the fluorescent layer includes from 1 wt % to 20 wt % of yellow phosphor and from 1 wt % to 20 wt % of red phosphor. The yellow phosphor is a YAG phosphor, a silicate phosphor or an aluminum phosphor. The red phosphor is a nitride phosphor) or a sulfide phosphor. When the blue light passes through the fluorescent layer 12, the fluorescent layer 12 transforms a part of the blue light to a yellow light and a red light. Then, the blue light, the yellow light, and the red light are mixed to form white light, the first light beam L1.

By the illumination of the white light of the blue chip 11 and the fluorescent layer 12, the eyes of users are not fatigued nor easily damaged.

Figure 3:
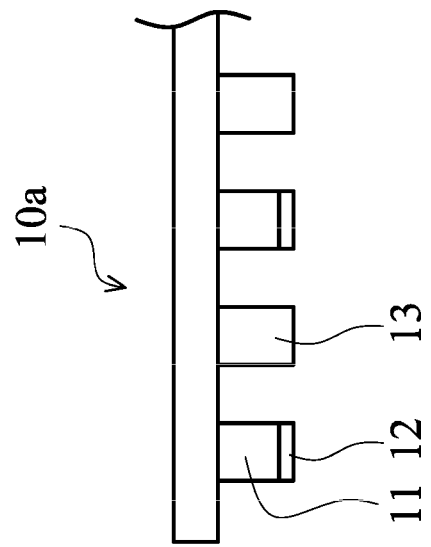
FIG. 3 is a schematic view of the first light module according to another case of the present disclosure.

FIG. 3 is a schematic view of the first light module 10 according to another case of the present disclosure. In this case, the first light module 10 includes a plurality of green chips 13. The green chip 13 may be a GaN green LED to emit a green light. The substrate used in the epitaxial process for green chip 13 may include Sapphire, SiC, or Si. The fluorescent layer 12 includes from 1 wt % to 20 wt % of red phosphor. The red phosphor a nitride phosphor or a sulfide phosphor. When the blue light passes through the fluorescent layer 12, the fluorescent layer 12 transforms a part of the blue light into a red light. Then, the red light, the blue light, and the green light are mixed to form white light, the first light beam L1.

In the embodiment, the green light has a wavelength in a range from 500 nm to 540 nm, and the red light has wavelength in a range from 620 nm to 680 nm. By the illumination of the white light of the blue chip 11, the fluorescent layer 12, and the green chip 13, the eyes of users are not fatigued nor easily damaged.

The second light module 20 includes a plurality of blue chips 21 and a plurality of fluorescent layers 22 respectively disposed on the blue chips 21. The third light module 30 includes a plurality of blue chips 31 and a plurality of fluorescent layers 32 respectively disposed on the blue chips 31. The structures of the second light module 20 and the third light module 30 are the same or similar, and the descriptions of the first light module 10 in the described embodiments are as a reference thereof. The blue chips 21 and 31 and the fluorescent layers 22 and 32 of the second light module 20 and the third light module 30 may be similar to or the same as the disclosed first light modules 10. The second light module 20 and the third light module 30 may include the green chip 13.

In the embodiment, the main wave peaks of the blue chips 21 and 31 of the second light module 20 and the third light module 30 are in a range from 461 nm to 480 nm, or in a range from 420 nm to 460 nm, such as at 455 nm, 447 nm, or 441 nm. Namely, the main wave peaks of the blue chips 21 and 31 of the second light module 20 and the third light module 30 are lower than the main wave peak of the blue light of the first light module 10. Thus, the luminous efficacy and the environment blue light of the white light of the second light module 20 and the third light module 30 are increased.

The blue light hazard action factor of the first light module 10 is 10%, 20%, or 30% (10% in the embodiment) lower than or equal to the blue light hazard action factor of the second light module 20 and the third light module 30. Moreover, the circadian stimulus factor of the first light module 10 is 10%, 20%, or 30% greater than the circadian stimulus factor of the second light module 20 and the third light module 30. In another case, the first light module 10, the second light module 20, and the third light module 30 have the same circadian stimulus factor. In the embodiment, the circadian stimulus factor of the first light module 10 is 10% greater than the circadian stimulus factor of the second light module 20 and the third light module 30. The greater circadian stimulus factor means that the user's alertness, learning efficiency, and working efficiency are increased by stimulation by the blue light.

The circadian stimulus factor (CS/W) is defined as circadian stimulus per watt. The formula of the circadian stimulus is described as follows.

$$CS = \int X_{e\lambda} \cdot C(\lambda) d\lambda$$

In the formula, the $X_{e\lambda}$ is a spectral power distribution, $C(\lambda)$ is a circadian system function, and $\lambda$ is a wavelength.

The second light beam L2 and the third light beam L3 are emitted to the wall W1 or ceiling W2 as illumination, and increase the blue light in the environment. Moreover, the second light beam L2 and the third light beam L3 are diffusely reflected by the wall W1 or ceiling W2, and thus the area receiving the blue light of the intrinsically photosensitive Retinal ganglion cells (ipRGC) of retinas is increased, and the alertness of users is increased. Moreover, since the second light beam L2 and the third light beam L3 are diffusely reflected, and the blue light of the environment is uniformly received by a wider retina area rather than a spot point, the effective blue light hazard radiance quantities to the eyes of users is decreased.

Moreover, users may feel like relaxing and melatonin secretion may not be influenced. In the seventh group of table 1, since the second light module 20 and the third light module 30 have greater luminous efficiency, the seventh group may be applied in illumination and saving power.

Therefore, one having ordinary skill in the art may manufacture various kinds of illuminating devices 1 according to the present disclosure.

TABLE 1

| group | First light module 10 | Second light module 20 | Third light module 30 |
|---|---|---|---|
| 1 | 463 nm ≤ λp ≤ 480 nm | | |
| 2 | BLH/W: 10% less than the second and the third light modules | CS/W: 10% greater than the first light module | CS/W: 10% greater than the first light module |
| 3 | BLH/W: 10% less than the second and the third light modules | Color temperature: 6000 K~7000 K | Color temperature: 6000 K~7000 K |
| 4 | BLH/W: 10% less than the second and the third light modules | Color temperature: 4000 K~5000 K | Color temperature: 4000 K~5000 K |
| 5 | BLH/W: 10% less than the second and the third light modules | CS/W: 10% greater than the first light module | CS/W: 10% less than the first light module |
| 6 | BLH/W: 10% less than the second and the third light modules | Color temperature: 2500 K~3500 K | Color temperature: 2500 K~3500 K |
| 7 | BLH/W: 10% less than the second and the third light modules | Luminous efficiency: 10% greater than the first light module | Luminous efficiency: 10% greater than the first light module |

Moreover, the luminous efficiencies (lm/W) of the second light module 20 and the third light module 30 are 10%, 20%, or 30% greater than the luminous efficiency of the first light module 10. In another case, the luminous efficiencies of the first light module 10, the second light module 20, and the third light module 30 are the same. In the embodiment, the luminous efficiencies of the second light module 20 and the third light module 30 are 10% greater than the luminous efficiency of the first light module 10 to save power. In the disclosed embodiment, the first light module 10, the second light module 20, and the third light module 30 may be selectively enabled or disabled by users.

In the embodiment, the parameters of the first light module 10, the second light module 20, and the third light module 30 are shown in table 1. In the first group of table 1, the second light module 20 and the third light module 30 are disabled, the first light beam L1 emitted downward by the first light module 10 has a lower blue light hazard. In the second group of table 1, the second group may be applied to daytime, the second light beam L2 and the third light beam L3 emitted to the wall and the ceiling has greater a circadian stimulus factor. Thus, since the circadian stimulus is increased, the working and the learning efficiency of users is raised. In the third group of table 1, since the color temperatures of the second light beam L2 and the third light beam L3 are from 6000K to 7000K, the third group may be applied to working and learning to decrease eye fatigue. In the fourth group of table 1, since the color temperatures of the second light beam L2 and the third light beam L3 are from 4000K to 5000K, the users may feel relaxed and revived. In the fifth group of table 1, since the second light beam L2 and the third light beam L3 have lower circadian stimulus factors, the fifth group may be applied to housework and to lower the interference of physiology. In the sixth group of table 1, since the color temperatures of the second light beam L2 and the third light beam L3 are from 2500K to 3000K, the sixth group has the lowest circadian stimulus factor and is adapted to household life at night.

Figure 4:
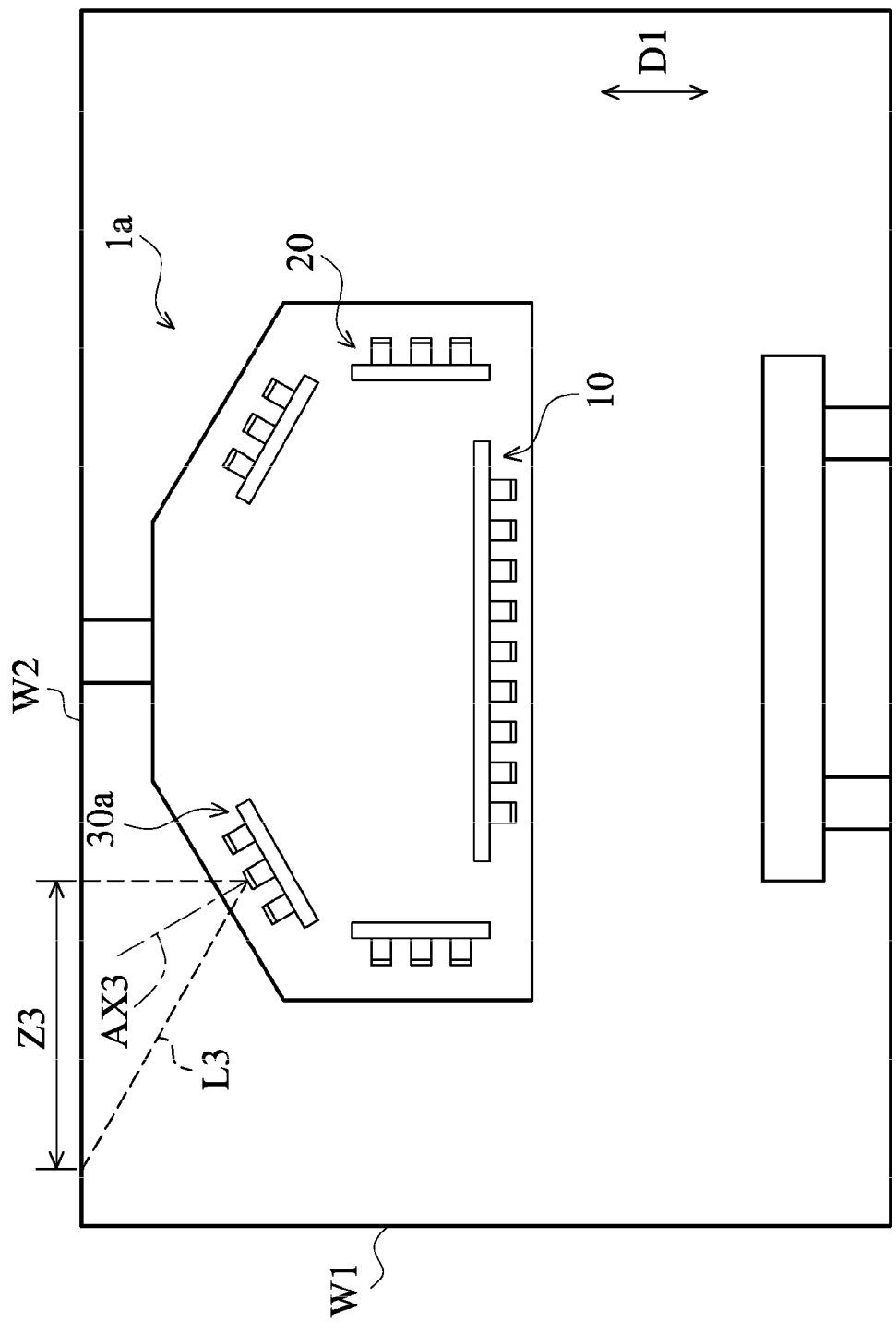
FIG. 4 is a schematic view of an illuminating device according to a second embodiment of the present disclosure.

FIG. 4 is a schematic view of an illuminating device 1a according to a second embodiment of the present disclosure. The main differences between the second embodiment and the first embodiment are described as follows. The third angle between the third optical axis AX3 of the third light module 30a and the vertical direction D1 is from 30 degrees to 60 degrees. In the embodiment, the angle is about 45 degrees, and thus the energy efficiency of the third light module 30a is increased.

Figure 5:
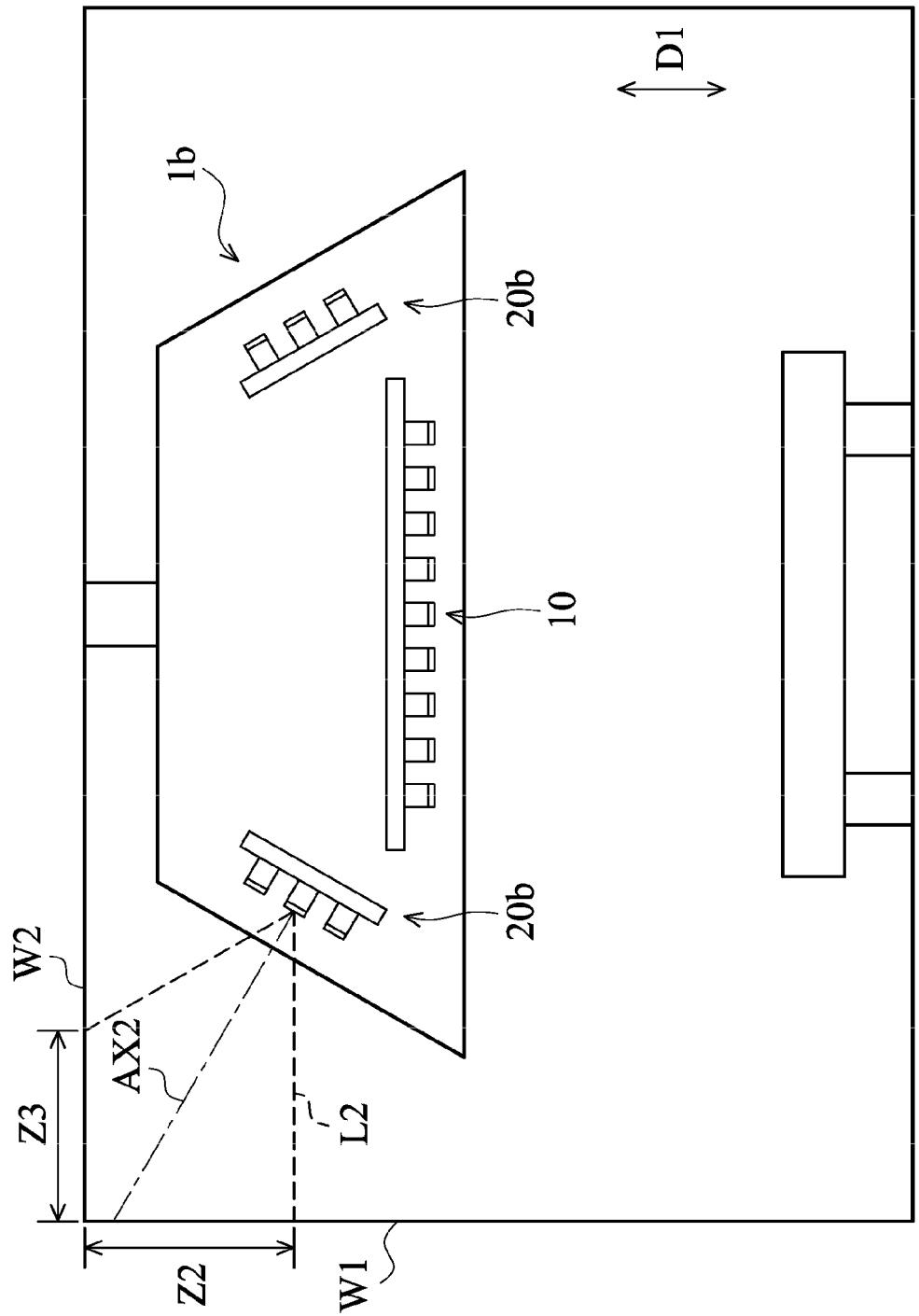
FIG. 5 is a schematic view of the illuminating device according to a third embodiment of the present disclosure.

FIG. 5 is a schematic view of the illuminating device 1b according to a third embodiment of the present disclosure. The main differences between the third embodiment and the first embodiment are described as follows. The third light module 30 is not included in the third embodiment. The second angle between the second optical axis AX2 of the second light module 20b and the vertical direction D1 is from 35 degrees to 70 degrees. In the embodiment, the angle is about 50 degrees. The second light beam L2 of the second light module 20b is emitted to the second illuminating area Z2 and the third illuminating area Z3 (the wall W1 and the ceiling W2). Thus, the third embodiment may be applied to a small space or a space that does not need a higher brightness, to save power.

The illuminating device may be an elongated structure or a square structure, such as a grille lamp used in offices, or a ceiling lamp used in schools, but it not limited thereto. The illuminating device may be a spherical structure (such as a bulb lamp), an elliptical structure, or a trapezoid structure.

FIG. 6 is a schematic view of an illuminating device 1c according to a fourth embodiment of the present disclosure. The illuminating device 1c is a bulb lamp including a supporting element 40 with a spherical structure. The supporting element 40 is made of metal, plastic, or glass. The first light module 10c is disposed on the top of the supporting element 40 of the illuminating device 1c. The second light module 20c and the third light module 30c are disposed on a sidewall of the supporting element 40. The supporting element 40 has a spherical curved surface. Thus, since the first light module 10c, the second light module 20c, and the third light module 30c are disposed on the surface of the supporting element 40, the light beams of the first light module 10c, the second light module 20c, and the third light module 30c can be emitted to different illuminating areas.

In conclusion, the illuminating device of the present disclosure utilizes an illuminating device including a blue chip having a main wave peak in a range from 461 nm to 480 nm. Thus, a light having wavelength from 445 nm to 460 nm, which can damage retinas, is not good for eye-care. Moreover, a second light module may be utilized to increase the luminance of an environment and the circadian stimulus factor, and thus the working efficiency of users is increased.

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. An illuminating device, comprising:
   a first light module emitting a first light beam to a first illuminating area, wherein the first light module comprises a first blue chip to emit a blue light;
   a second light module emitting a second light beam to a second illuminating area; and
   wherein the blue light emitted by the blue chip has a main wave peak in a range from 461 nm to 480 nm, and
   wherein the second illuminating area is different from the first illuminating area.

2. The illuminating device as claimed in claim 1, wherein the first light module further comprises a fluorescent layer disposed on the blue chip.

3. The illuminating device as claimed in claim 2, wherein the fluorescent layer comprises a green phosphor and a red phosphor, and the blue light emitted by the first blue chip is to form the first light beam by passing through the fluorescent layer.

4. The illuminating device as claimed in claim 2, wherein the fluorescent layer comprises a yellow phosphor and a red phosphor, and the blue light emitted by the first blue chip is to form the first light beam by passing through the fluorescent layer.

5. The illuminating device as claimed in claim 2, wherein the first light module comprises a green chip to emit a green light.

6. The illuminating device as claimed in claim 5, wherein the fluorescent layer comprises a red phosphor to transform a part of the blue light emitted by the first blue chip to a red light, and the red light, the blue light, the green light are mixed to form the first light beam.

7. The illuminating device as claimed in claim 6, wherein the green light has a main wave peak in a range from 500 nm to 540 nm, and the red light has a main wave peak in a range from 620 nm to 680 nm.

8. The illuminating device as claimed in claim 1, wherein the first light beam and the second light beam are white light.

9. The illuminating device as claimed in claim 1, wherein the second light module comprises a second blue chip to emit a blue light, and the blue light emitted by the second blue chip has a main wave peak lower than the main wave peak of the blue light emitted by the first blue chip.

10. The illuminating device as claimed in claim 9, wherein the main wave peak of the blue light emitted by the second blue chip is in a range from 420 nm to 460 nm.

11. The illuminating device as claimed in claim 1, wherein the first light module has a first blue light hazard action factor, the second light module has a second blue light hazard action factor, and the first blue light hazard action factor is lower than the second blue light hazard action factor.

12. The illuminating device as claimed in claim 1, wherein the first light module has a first circadian stimulus factor, the second light module has a second circadian stimulus factor, and the second circadian stimulus factor is greater than or equal to the first circadian stimulus factor.

13. The illuminating device as claimed in claim 12, wherein the first circadian stimulus factor is 10% greater than second circadian stimulus factor.

14. The illuminating device as claimed in claim 1, wherein the first light beam has a first light beam fan angle from 30 degrees to 80 degrees.

15. The illuminating device as claimed in claim 1, wherein the first light beam and the second light beam have color temperatures from 2500K to 3500K, from 6000K to 7000 k, or from 4000K to 5000K.

16. The illuminating device as claimed in claim 1, wherein the first light module has a first luminous efficiency, the second light module has a second luminous efficiency, and the second luminous efficiency is greater than or equal to the first luminous efficiency.

17. The illuminating device as claimed in claim 16, wherein the second luminous efficiency is 10% greater than the first luminous efficiency.

18. The illuminating device as claimed in claim 1, wherein the first illuminating area is defined as an active area for users, and the second illuminating area is located at a wall and/or ceiling.

19. The illuminating device as claimed in claim 1, wherein the first light beam has a first optical axis, and a first angle between the first optical axis and a vertical direction is from 0 degree to 45 degrees, wherein the second light beam has a second optical axis, and a second angle between the second optical axis and the vertical direction is from 45 degrees to 90 degrees.

20. The illuminating device as claimed in claim 1, comprising a third light module emitting a third light beam to a third illuminating area.

21. The illuminating device as claimed in claim 20, wherein the third light module comprises a third blue chip to emit a blue light, and the blue light emitted by the third blue chip has a main wave peak lower than the blue light emitted by the first blue chip.

22. The illuminating device as claimed in claim 21, wherein the blue light emitted by the third blue chip has a main wave peak in a range from 420 nm to 460 nm.

23. The illuminating device as claimed in claim 20, wherein the first light module has a first blue light hazard action factor, the third light module has a third blue light hazard action factor, and the first blue light hazard action factor is lower than or equal to the third blue light hazard action factor.

24. The illuminating device as claimed in claim 23, wherein the first blue light hazard action factor is 10% lower than the third blue light hazard action factor.

25. The illuminating device as claimed in claim 20, wherein the first light module has a first circadian stimulus factor, the third light module has a third circadian stimulus factor, and the third circadian stimulus factor is greater than or equal to the first circadian stimulus factor.

26. The illuminating device as claimed in claim 25, wherein the third circadian stimulus factor is 10% greater than the first circadian stimulus factor.

27. The illuminating device as claimed in claim 20, wherein the third light beam is a white light having a color temperature from 2500K to 3500K, from 6000K to 7000 k, or from 4000K to 5000K.

28. The illuminating device as claimed in claim 20, wherein the first light module has a first luminous efficiency, the third light module has a third luminous efficiency, and the third luminous efficiency is greater than or equal to the first luminous efficiency.

29. The illuminating device as claimed in claim 28, wherein the third luminous efficiency is 10% greater than the first luminous efficiency.

30. The illuminating device as claimed in claim 20, wherein the second illuminating area is located at a wall or ceiling, and the third illuminating area is located at a ceiling or wall.

31. The illuminating device as claimed in claim 20, wherein the third light beam has a third optical axis, and a third angle between the third optical axis and a vertical direction is from 0 degree to 60 degrees.

32. An illuminating device, comprising:
a light module emitting a light beam,
wherein the light module comprises:
a blue chip to emit a blue light, and the blue light has a main wave peak in a range from 461 nm to 480 nm; and
a fluorescent layer, disposed on the blue chip, comprising a red phosphor to transform a part of the blue light to a red light.

33. The illuminating device as claimed in claim 32, wherein the fluorescent layer further comprises a green phosphor, and the blue light is to form the light beam by passing through the fluorescent layer.

34. The illuminating device as claimed in claim 32, wherein the fluorescent layer further comprises a yellow phosphor, and the blue light is to form the light beam by passing through the fluorescent layer.

35. The illuminating device as claimed in claim 32, wherein the light module comprises a green chip to emit a green light.

36. The illuminating device as claimed in claim 35, wherein the red light, the blue light, and the green light are mixed to form the light beam.

37. The illuminating device as claimed in claim 36, wherein the green light has a main wave peak in a range from 500 nm to 540 nm, and the red light has a main wave peak in a range from 620 nm to 680 nm.

38. The illuminating device as claimed in claim 32, wherein the light beam is a white light.

39. The illuminating device as claimed in claim 32, wherein the light beam has a first light beam fan angle from 30 degrees to 80 degrees.

40. A light module to emit a light beam, comprising:
a blue chip emitting a blue light; and
a fluorescent layer, disposed on the blue chip, comprising a red phosphor to transform a part of the blue light to a red light,
wherein the blue light has a main wave peak in a range from 461 nm to 480 nm.

41. The light module as claimed in claim 40, wherein the fluorescent layer further comprises a green phosphor, and the blue light is to from the light beam by passing through the fluorescent layer.

42. The light module as claimed in claim 40, wherein the fluorescent layer further comprises a yellow phosphor, and the blue light is to form the light beam by passing through the fluorescent layer.

43. The light module as claimed in claim 40, wherein the light module further comprises a green chip to emit a green light.

44. The light module as claimed in claim 43, wherein the red light, the blue light, and the green light are mixed to form the light beam.

45. The light module as claimed in claim 44, wherein the green light has a main wave peak in a range from 500 nm to 540 nm, and the red light has a main wave peak in a range from 620 nm to 680 nm.

46. The light module as claimed in claim 40, wherein the light beam is a white light.

47. The light module as claimed in claim 40, wherein the light beam has a first light beam fan angle from 30 degrees to 80 degrees.

48. An illuminating device, comprising:
a first light module emitting a first light beam to a first illuminating area, wherein the first light module comprises a first blue chip to emit a blue light;
a second light module emitting a second light beam to a second illuminating area; and
wherein the blue light emitted by the blue chip has a main wave peak in a range from 461 nm to 480 nm, and
wherein the first light module has a first blue light hazard action factor, the second light module has a second blue light hazard action factor, and the first blue light hazard action factor is lower than the second blue light hazard action factor.

49. An illuminating device, comprising:
a first light module emitting a first light beam to a first illuminating area, wherein the first light module comprises a first blue chip to emit a blue light;
a second light module emitting a second light beam to a second illuminating area; and
wherein the blue light emitted by the blue chip has a main wave peak in a range from 461 nm to 480 nm, and
wherein the first light module has a first circadian stimulus factor, the second light module has a second circadian stimulus factor, and the second circadian stimulus factor is greater than or equal to the first circadian stimulus factor.

* * * * *